US007884784B2

United States Patent
Repetto et al.

(10) Patent No.: US 7,884,784 B2
(45) Date of Patent: *Feb. 8, 2011

(54) TRANSPARENT LED DISPLAY

(75) Inventors: Piermario Repetto, Orbassano (IT); Sabino Sinesi, Orbassano (IT); Sara Padovani, Orbassano (IT); Stefano Bernard, Orbassano (IT); Denis Bollea, Orbassano (IT); Davide Capello, Orbassano (IT); Piero Perlo, Orbassano (IT); Alberto Pairetti, Amaro (IT); Michele Antonipieri, Amaro (IT)

(73) Assignee: C.R.F. Societa Consortile Per Azioni, Orbassano (Torino) (IT)

( * ) Notice: Subject to any disclaimer, the term of this patent is extended or adjusted under 35 U.S.C. 154(b) by 1056 days.

This patent is subject to a terminal disclaimer.

(21) Appl. No.: 11/399,208

(22) Filed: Apr. 6, 2006

(65) Prior Publication Data
US 2006/0238327 A1 Oct. 26, 2006

(30) Foreign Application Priority Data
Apr. 21, 2005 (EP) ................................. 05425256

(51) Int. Cl.
G09G 3/32 (2006.01)
(52) U.S. Cl. .............................. 345/82; 345/39; 345/84; 340/459; 340/461
(58) Field of Classification Search .................. 345/30, 345/39, 55, 82, 84; 340/459, 461; 438/28
See application file for complete search history.

(56) References Cited

U.S. PATENT DOCUMENTS 4,445,132 A 4/1984 Ichikawa et al. .............. 357/32

(Continued)

FOREIGN PATENT DOCUMENTS

EP 0177134 4/1986

(Continued)

OTHER PUBLICATIONS

European Patent Office Search Report, Application No. 05425256.4-2203, Nov. 3, 2005, 2 pages.

(Continued)

Primary Examiner—Quan-Zhen Wang
Assistant Examiner—Sahlu Okebato
(74) Attorney, Agent, or Firm—Heslin Rothenberg Farley & Mesiti P.C.; Victor A. Cardona, Esq.

(57) ABSTRACT

Described herein is a transparent-display device for motor vehicles, to be used for presentation of information to the driver and/or to the passengers, said device comprising a plurality of LED sources, addressable individually or in groups through a series of conductive paths, deposited on a transparent underlayer and connected to a control electronics, in which: i) said LED sources are integrated in the form of dice, i.e., of elements obtained by dividing up a semiconductor wafer and without package; ii) said dice are integrated on, and electrically connected to, said underlayer via technologies of the chip-on-board type; and iii) said transparent underlayer 1 is pre-arranged for being at least in part superimposed on the windscreen of the vehicle, in such a way that at least part of the information presented to the user is superimposed on the background, said background being visible to the user through said windscreen.

11 Claims, 6 Drawing Sheets

U.S. PATENT DOCUMENTS

| | | | | |
|---|---|---|---|---|
| 4,774,434 A * | 9/1988 | Bennion | ........................ | 313/500 |
| 4,795,223 A * | 1/1989 | Moss | ........................... | 345/7 |
| 5,005,009 A * | 4/1991 | Roberts | ........................ | 345/7 |
| 5,043,716 A * | 8/1991 | Latz et al. | ..................... | 345/82 |
| 5,278,432 A | 1/1994 | Ignatius et al. | ................ | 257/88 |
| 5,334,916 A * | 8/1994 | Noguchi | ..................... | 315/309 |
| 5,469,184 A * | 11/1995 | Mount | ........................... | 345/7 |
| 5,632,551 A * | 5/1997 | Roney et al. | ................. | 362/485 |
| 5,638,052 A * | 6/1997 | Furuya et al. | .......... | 340/815.45 |
| 5,818,404 A * | 10/1998 | Lebby et al. | .................. | 345/82 |
| 5,878,395 A * | 3/1999 | Bennett | ...................... | 704/275 |
| 5,892,598 A * | 4/1999 | Asakawa et al. | .............. | 359/13 |
| 6,115,008 A * | 9/2000 | Palalau et al. | .................. | 345/7 |
| 6,871,982 B2 * | 3/2005 | Holman et al. | ................ | 362/331 |
| 6,913,794 B2 * | 7/2005 | Hoult et al. | ................. | 427/521 |
| 7,038,593 B2 * | 5/2006 | Pederson | ............... | 340/815.45 |
| 7,138,659 B2 * | 11/2006 | Raos et al. | .................... | 257/79 |
| 7,140,751 B2 * | 11/2006 | Lin | ........................ | 362/249.02 |
| 7,285,903 B2 * | 10/2007 | Cull et al. | .................... | 313/500 |
| 2002/0084952 A1 | 7/2002 | Morley et al. | .................... | 345/32 |
| 2002/0097579 A1 * | 7/2002 | Stalions | ...................... | 362/241 |
| 2003/0072153 A1 * | 4/2003 | Matsui et al. | ................ | 362/231 |
| 2003/0223236 A1 | 12/2003 | Wu | ............................. | 362/247 |
| 2004/0240890 A1 * | 12/2004 | Lys et al. | .................... | 398/182 |
| 2005/0051777 A1 * | 3/2005 | Hill | ............................. | 257/72 |
| 2005/0051785 A1 * | 3/2005 | Erchak et al. | ................. | 257/98 |

FOREIGN PATENT DOCUMENTS

| | | |
|---|---|---|
| EP | 0588040 A2 | 3/1994 |
| EP | 1460609 A2 | 9/2004 |
| JP | 62215289 | 9/1987 |
| WO | WO 03/012884 A1 | 2/2003 |
| WO | WO 2004/068596 A1 | 8/2004 |

OTHER PUBLICATIONS

U.S. Appl. No. 11/397,225, filed Apr. 4, 2006, Repetto et al.
U.S. Appl. No. 11/398,358, filed Apr. 5, 2006, Repetto et al.

* cited by examiner

TRANSPARENT LED DISPLAY

CROSS-REFERENCE TO RELATED APPLICATION

This application claims priority from European Patent Application No. 05425256.4, filed on Apr. 21, 2006, the entire disclosure of which is incorporated herein by reference.

BACKGROUND OF THE INVENTION

The present invention relates to a device for the presentation of information in vehicle applications, in particular automotive applications.

As is known, a vehicle comprises many devices for the presentation of information to the driver and/or to the passengers; the number and the information content of said devices has increased constantly over the years on account of the increasing information content coming from vehicle systems.

Displays for vehicle applications are generally classified in the following categories:

displays arranged on the dashboard or instrument panel, in front of the driver; these comprise:
- backlit icons for signalling information regarding the state of the vehicle (for example: hand brake, direction indicators, headlights, diagnostics on front and rear lights, foglights, rear foglights, engine-oil temperature, parking brake);
- analogical dials for indication of the fuel level, engine r.p.m., vehicle speed, time, etc.;
- backlit liquid-crystal displays, for alphanumeric information (total kilometers, partial kilometers travelled, etc.);
- backlit liquid-crystal displays of the dot-matrix type, for returning information coming from the body computer (for example, average speed, average and instantaneous consumption, autonomy, etc.);

displays arranged at the centre of the dashboard, in the area half way between the driver and the passenger; these typically comprise:
- backlit liquid-crystal displays of the active-matrix type, for displaying information coming from the GPS navigator (medium-high range), including indications and maps; the same display is typically used to present additional information (air-conditioning system, radio/CD, telephone, info-telematics, cruise information coming from the body computer, etc.);
- alternatively to the foregoing, backlit liquid-crystal displays of the passive-matrix type, for displaying information coming from the GPS navigator (medium-low range), with the exclusion of maps;

displays arranged on the windscreen or on a viewer set between the driver and the windscreen; these displays are known by the term head-up displays (or HUDs) and afford the possibility of returning information in the following mode:
- superimposed on the background, in the periphery of the field of view of the driver, whilst he performs the primary task of driving; this reduces the movement of eyes/head necessary for the driver to have access to the visual information and hence the time for which the driver takes his eyes off the road;
- at a certain distance from the driver, typically ranging from 2 m to infinity, in such a way that the driver does not have to adapt the focal length of his eye for accessing the information.

HUDs are typically used for returning information regarding navigation, or information that is critical for the safety of the vehicle; they can also be used for night vision.

Notwithstanding the possible ergonomic advantages deriving from the use of displays of a HUD type, their diffusion is currently limited by the following factors:
i. cost of the system;
ii. difficulty of installation/alignment;
iii. encumbrance of the projection-optics chain, which is typically installed in the dashboard between the visor or sunshield of the instrument panel and the windscreen;
iv. high consumption of the source of light in so far as the light that reaches the driver's eye is only a minimal fraction of the light emitted by the projection-optics chain (the luminance of the image is equal to 10-20% of the luminance at output from the projection-optics chain); this is rendered necessary by the fact that the reflecting screen, whether the windscreen or a viewer set between the windscreen and the driver, must transmit at least 80% of the light coming from the road so as not to obstruct vision;
v. reduced angle of visibility, in the sense that a movement of the driver's head greater than a certain amount (defined by the so-called head-motion-box or HMB) could lead the information either totally or partially to exit from the driver's field of view.

In HUD systems according to the known art (an example of which is represented in FIG. 1), the solution of one or more of these problems entails a complication of the others; purely by way of example, the enlargement of the HMB, referred to in point v, entails the use of projection optics of larger diameter, with a consequent increase in costs, referred to in point i, and in encumbrance, referred to in point iii.

With reference to FIG. 1, the light emitted by an image source 100 (for example, a microdisplay) is captured by a projection optics (Schmidt system), made up of a first mirror 101 and a second mirror 102, and is projected onto the windscreen 40 through a transparent protective window 103 typically positioned on the vehicle dashboard.

The mirror 102 is typically a complex aspherical mirror, the function of which is that of generating a virtual image of the source 100 (in combination with the first mirror 101) and of compensating the distortions of the image deriving from the asphericity of the windscreen 40.

The windscreen 40 reflects a percentage of the light coming from the projection optics towards the driver's eyes. In this way, the driver perceives a virtual image 60, which is located at a certain distance from the windscreen, said distance depending upon the projection optics, and is superimposed on the background 70.

SUMMARY OF THE INVENTION

The purpose of the present invention is to provide a device for the presentation of information to the driver according to a modality similar to that of the HUD devices of the type represented in FIG. 1, which does not suffer from the disadvantages referred to in points i, ii, iii, iv and v.

Said purpose is achieved by a transparent display according to claim 1. Further preferred and advantageous characteristics are indicated in the dependent claims.

BRIEF DESCRIPTION OF THE DRAWINGS

The invention will now be described with reference to the annexed plate of drawings, in which.

DETAILED DESCRIPTION OF THE INVENTION

Figure 1:
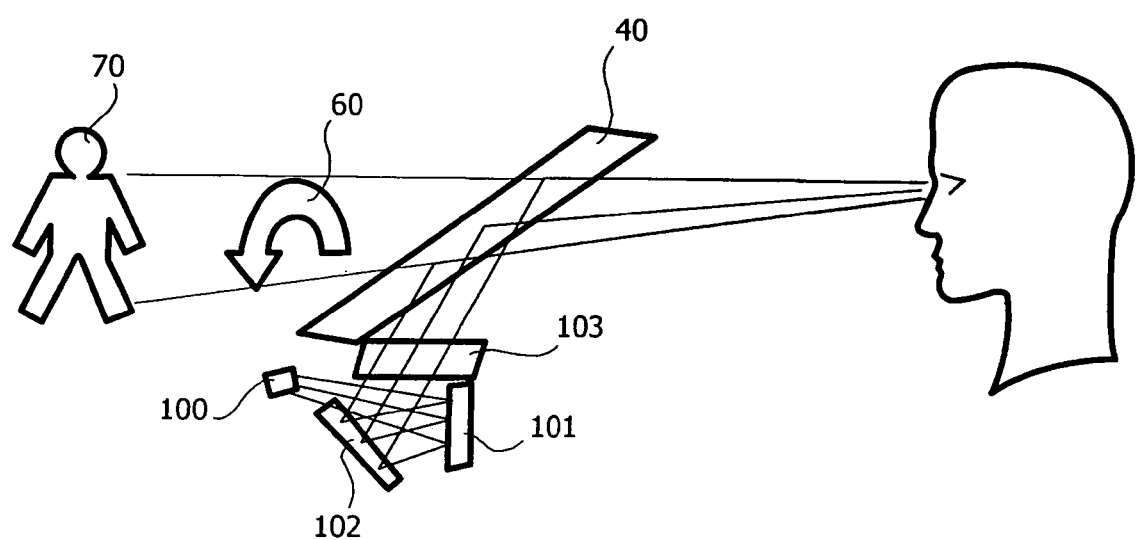
FIG. 1 illustrates the known art already described above.
Figure 2:
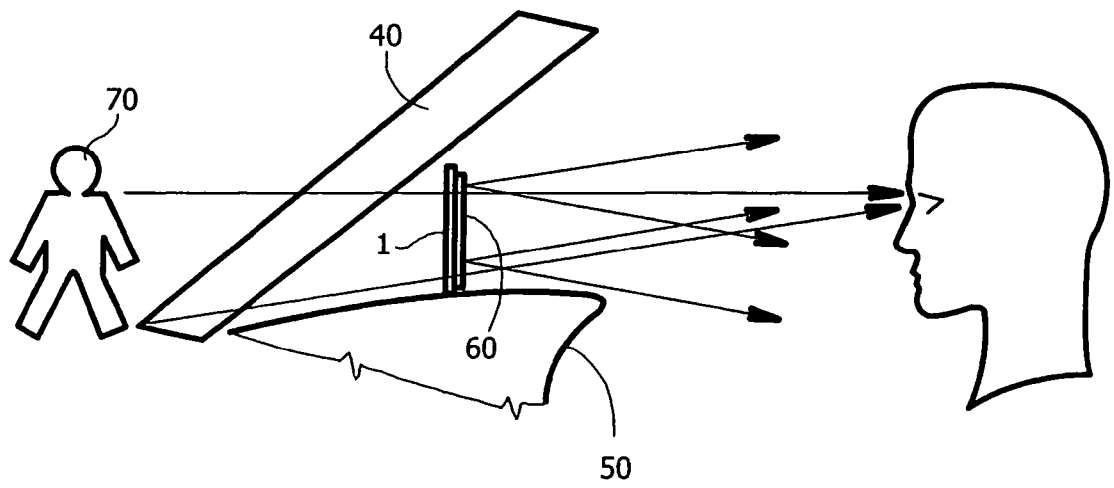
FIGS. 2-10 illustrate different variants of the display according to the invention.
Figure 3:
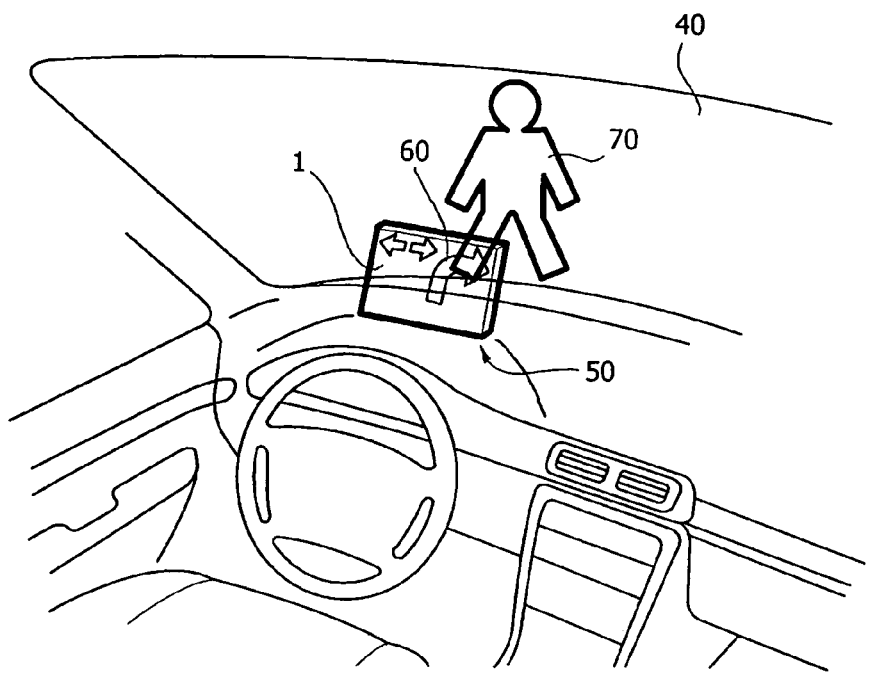

With reference to the figures, the invention envisages a transparent panel, i.e., one that is able to transmit at least in part the light coming from the road (namely, more than 70%), including a multiplicity of LED sources in the form of dice, i.e., of elements obtained by dividing up a semiconductor wafer and without package, said LED sources being integrated on said transparent instrument paned and organized so as to generate, by means of an appropriate control electronics, a predefined visual information 60.

The transparency of the display according to the present invention is maximized thanks to the use of the LED sources in the form of dice; said sources in the form of dice have in fact a typical surface area of just 0.1 m$^2$, which makes it possible to minimize obstruction of the background on account of said sources.

The transparent panel is typically installed on the dashboard 50 of the vehicle and positioned in the proximity of the windscreen 40, or alternatively is stuck on the windscreen itself.

In the display according to the present invention, the image 60 is presented directly on the transparent panel, i.e., is a real image, unlike what occurs in HUDs of the known art, in which the image 60 is virtual.

As occurs in HUDs of the known art, also in the display according to the present invention, the image 60 appears at least in part superimposed on the background 70, visible to the driver through the windscreen 40.

The advantages of the solution proposed are multiple and described in what follows with reference to points i, ii, iii, iv and v, referred to above.

I. the cost of the device is reduced as compared to solutions of the known art in so far as the system does not require costly projection optics, such as lenses and aspherical mirrors, which are typically used for compensating the distortions induced by the asphericity of the windscreen;

II. installation is achieved by simply positioning the screen on the dashboard in areas corresponding to the windscreen and is visible from any angle, in this way not requiring sophisticated and complex procedures of alignment; furthermore, installation does not require the use of sophisticated mechanics for positioning and alignment of said optical systems;

III. the encumbrance required for installation is minimal in so far as the system is not based upon the principle of projection, but rather on direct emission from the panel; the encumbrance of installation is thus limited to the connectors and possible proximity electronics that will be housed in the dashboard; the encumbrance is less than 200 ml as against 3-4 liters of a HUD solution according to the known art;

IV. the consumption levels are reduced in so far as the LED sources are directly in view; i.e., the effective luminance of the display is close to the luminance of the LED source; by way of example, in order to obtain with a HUD solution according to the known art an effective luminance of 5000 cd/m$^2$ (as required by automotive specifications) sources are used that emit over 150 lumen in all; the solution proposed herein enables the use, given the same luminance and field of view, of less than 80 lumen in all; and V. the HMB of the solution proposed herein is practically unlimited in so far as the sources emit in a lambertian way.

The transparency of the display enables installation on a motor vehicle up against the windscreen and hence at a distance from the driver greater than the distance of traditional displays integrated in the instrument panel. This implies that, even though the image generated by the display is real (in contrast to HUDs of the known art, which generate a virtual image), the distance between the driver and the image is maximized, so reducing accommodation of the focal length of the eye when the driver's glance shifts from the background to the display and vice versa.

Typically, HUDs of the known art present the image at a distance of 2-3 m from the driver, whilst the solution proposed herein enables a maximum distance of 1-1.2 m to be reached (on account of the physical constraints imposed by the windscreen). Even though the distance of the image is not sufficiently large to eliminate the effort of accommodation completely, the display of the present invention enables superimposition of the image on the background so as to minimize rotation of the driver's head and/or eyes necessary for accessing the visual information. From the latter standpoint, the display proposed herein is similar to a HUD of the known art, at the same time without prejudice to the advantages described above in points I, II, III, IV, V.

It should be noted how the fact that the focal distance is less than that of a classic HUD, albeit implying a greater effort of accommodation for the user, presents, however, an ergonomic advantage in so far as the change of focal length necessary for shifting the glance from the background 70 to the information 60 presented on the display implies a voluntary act on the part of the user; in a classic HUD display, instead, the image 60 of the display and the background 70 can be focused by the user almost simultaneously (thanks to the small difference between the distances of accommodation for said images 60 and 70), which implies:

the need for the brain to process and separate continuously the visual information corresponding to the real plane of the background 70 from that corresponding to the virtual plane of the image 60; and the risk that in the presence of an image 60 that is brighter or with more contrast with respect to the background 70 (for example, in conditions of poor visibility) the attention of the user is captured by the image of the display, thus reducing his concentration on the primary task of driving.

As has already been mentioned previously, the transparency of the display according to the present invention is maximized thanks to the use of LED sources in the form of dice. The sources in the form of dice have a typical surface area of just 0.1 mm, which makes it possible to minimize obstruction of the background on account of said sources. The LED sources in the form of dice are integrated in the device using technologies of the chip-on-board (or COB) type.

The use of transparent conductive paths, for example, made of transparent conductive oxide (TCO), enables further maximization of the transparency of the device.

The COB technique consists in mounting arrays of dice directly on an appropriate underlayer. Said technology first comprises the process known by the term "die bonding" (thermal connection or electro-thermal connection of the die to the underlayer), associated to which are possible operations of wire bonding (electrical connection of the chip to the circuit). Amongst the techniques of die bonding, the flip-chip methodology envisages turning over of chip and electro-thermal connection of its pads to the circuit, without using wires for the electrical connection, thus excluding a further wire-bonding process. In the flip-chip process, the connections of the pads are typically obtained by means of metal bumps (balls).

As final step, the COB process envisages packaging or protection of the source from the external stresses by means of an appropriate resin 1", which is also transparent.

According to a variant of the present invention, the use of a transparent (glass or plastic) overlayer (1') is envisaged; said overlayer 1' has the function of guaranteeing the planarity of the protective layer of transparent resin, not only in order to ensure transparency of the device but also to ensure that the panel will not distort the vision of the background and/or will not introduce optical power.

Figure 9:
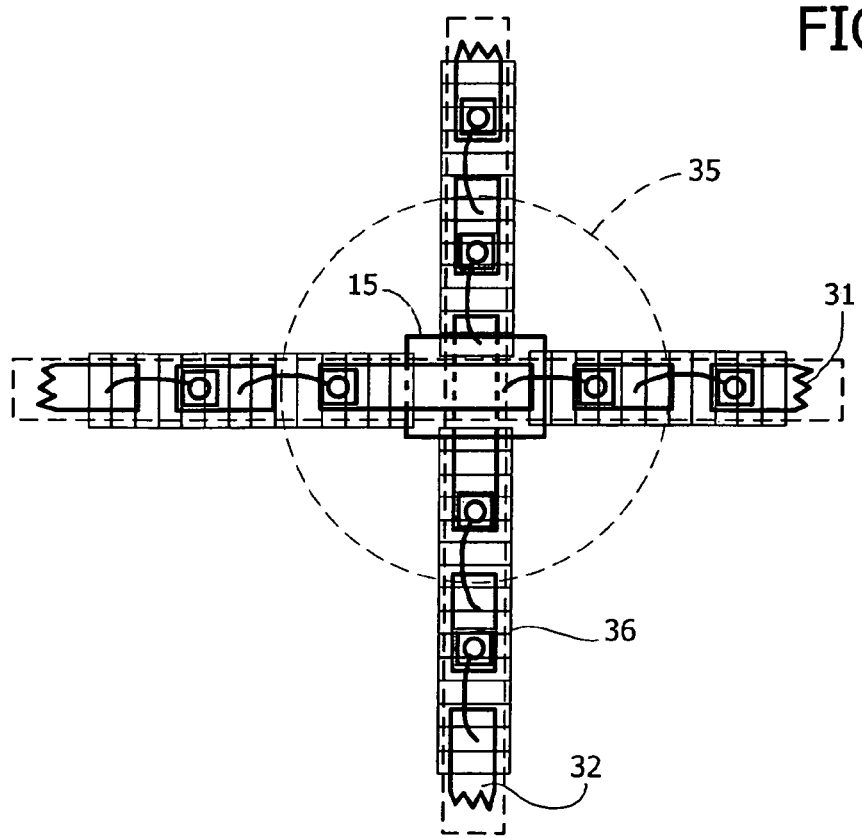

In this case, the transparent resin 1" is deposited in the form of a continuous layer that remains encapsulated between the underlayer 1 and the overlayer 1' (FIG. 9).

Figure 4:
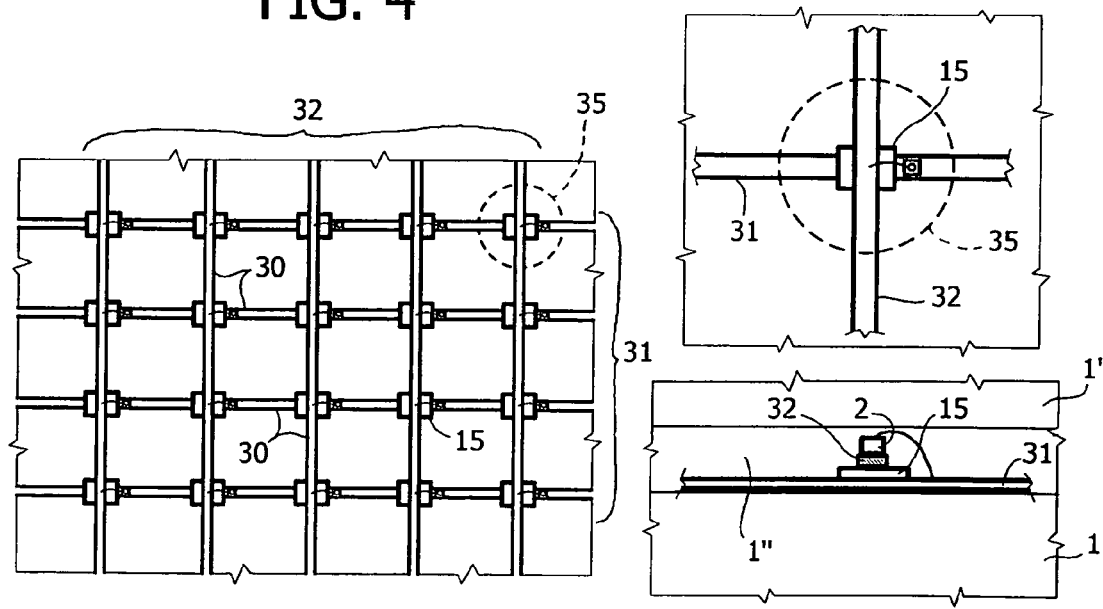

In a preferred embodiment, represented in FIG. 4, the dice are arranged in a matrix configuration, in which each LED is positioned at the point of crossing-over between a row 31 and a column 32, said row 31 and column 32 being constituted by paths of conductive material, in such a way as to be addressable individually through the application of an appropriate potential difference between said row and said column.

The rows are electrically insulated from the columns through a layer 15 of electrically insulating material, for example, silicon oxide, deposited on said rows 31 (for example, through an operation of thermal evaporation, e-beam evaporation, sputtering, CVD, spinning, dipping, etc.) in areas corresponding to the points of crossing-over 35 between said rows 31 and said columns 32.

Subsequently deposited on said layer 15 are the columns 32, constituted by electrically conductive material, for example, a metal or a transparent conductive oxide TCO.

Figure 5:
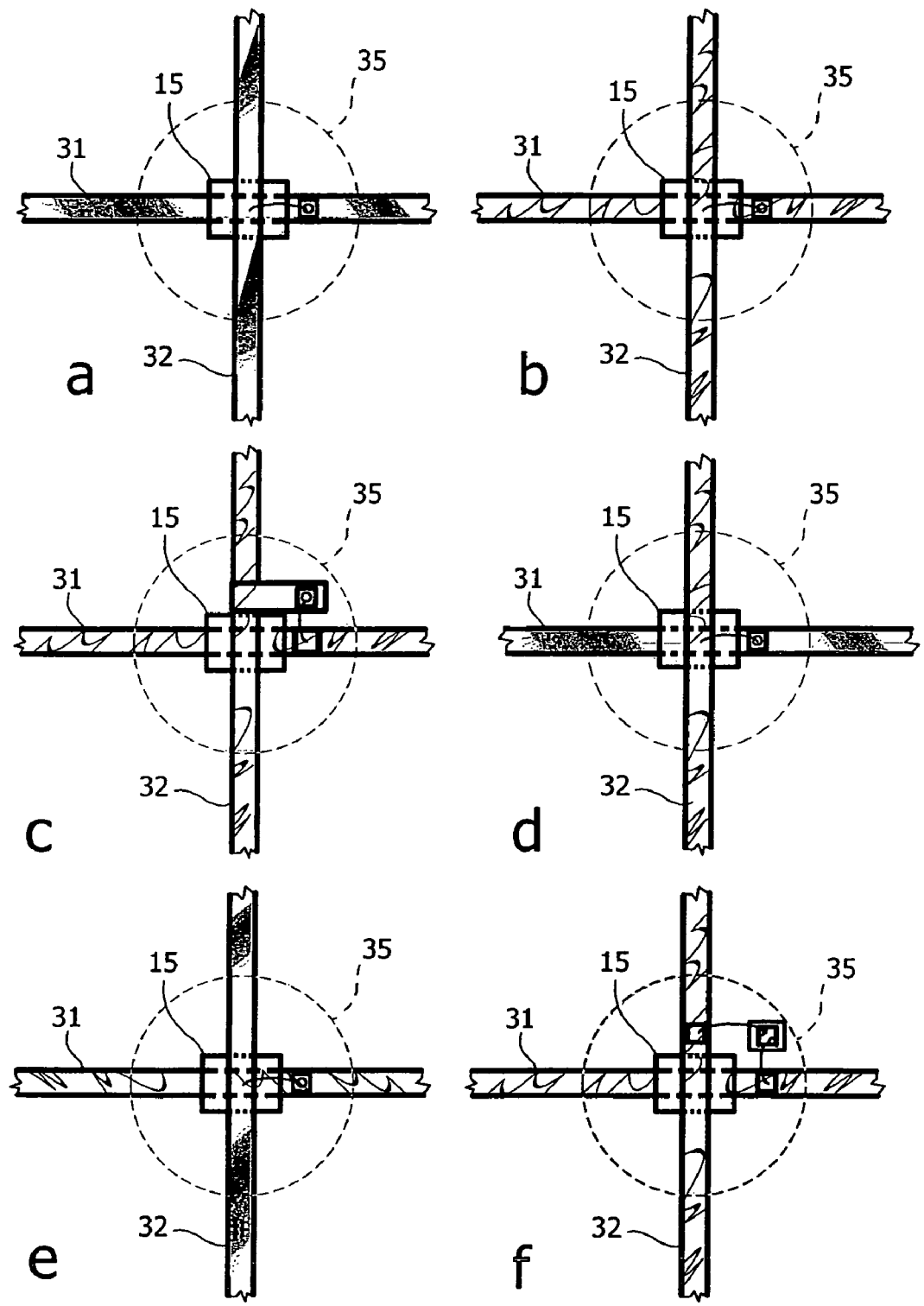

FIGS. 5a), b), c), d), e), f) and g) illustrate different variant embodiments in a generic point of crossing-over 35 between a generic row 31 and column 32.

In particular, the variants b), c) and f) illustrate the case where both the row 31 and the column 32 are made of TCO. The variant a) represents the case where both the row 31 and the column 32 are made of metal. The variants d) and e) represent the case where one of the two paths 31, 32 is made of TCO, and the other is made of metal.

It may be noted how, in the case where the path is made of TCO, the operation of electrical connection between said path and the die, whether this be an operation of die-attach, of wire bonding or die bonding (flip-chip technique), requires the deposition on the path of TCO of a metal pad for improving adhesion of the die or of the wire.

The variant f) represents the case where the die is of the type with horizontal electrodes, i.e., with both of the electrodes on the same face of the die; the integration of dice of this type can be obtained in two ways:

i. electrodes on the top surface: the electrodes are connected to the paths with operations of wire bonding; and ii. electrodes on the bottom surface (flip-chip technique): the electrodes are connected to the paths with a die-bonding operation using conductive bumps.

The variant f) represents the case described in point i). For each of said solutions it is moreover possible to adopt a variant in which column and row exchange their functions as regards connection to the LED (for example, in the case of solution a), the LED can be positioned on the column 32 and be connected to the row 31 through a gold wire).

Figure 6:
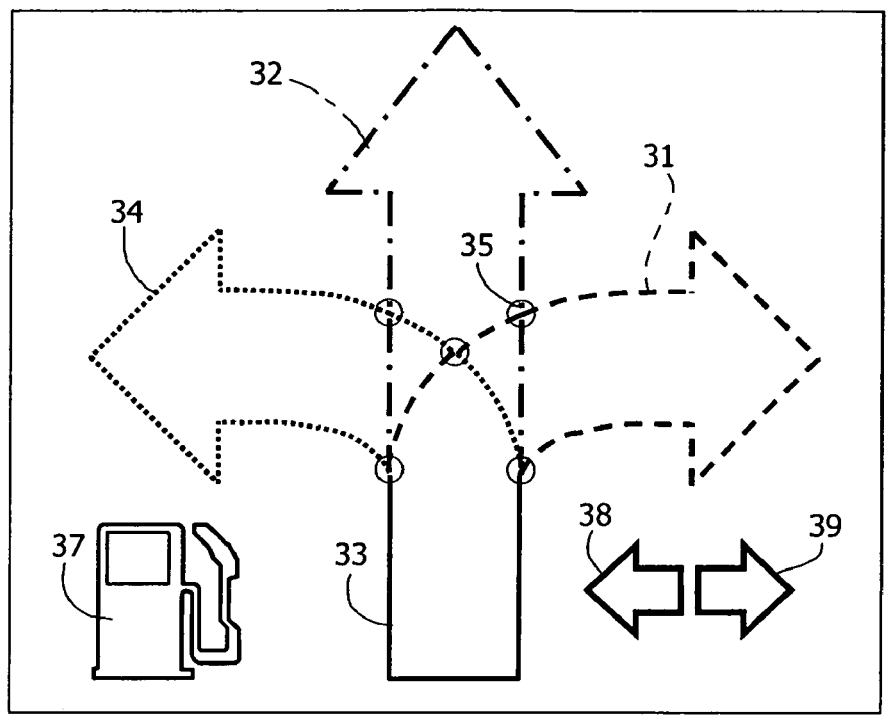
Figure 7:
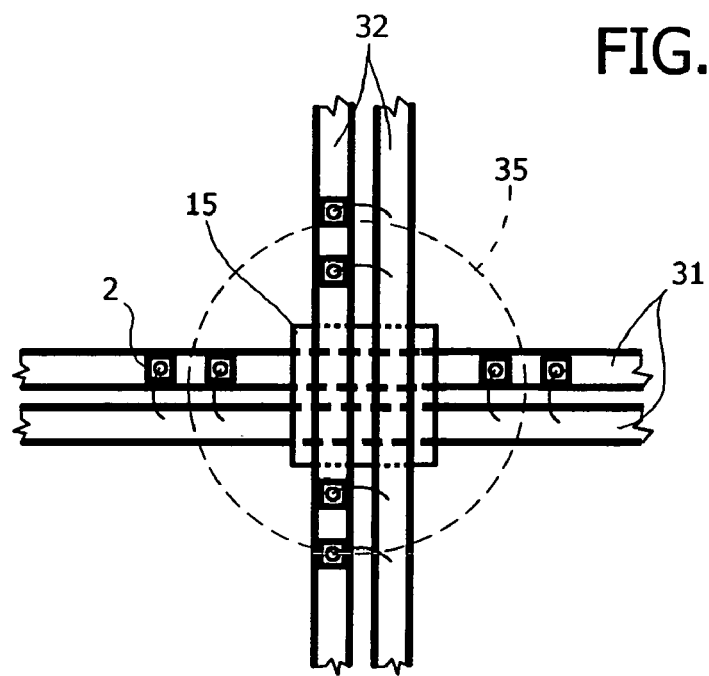
Figure 8:
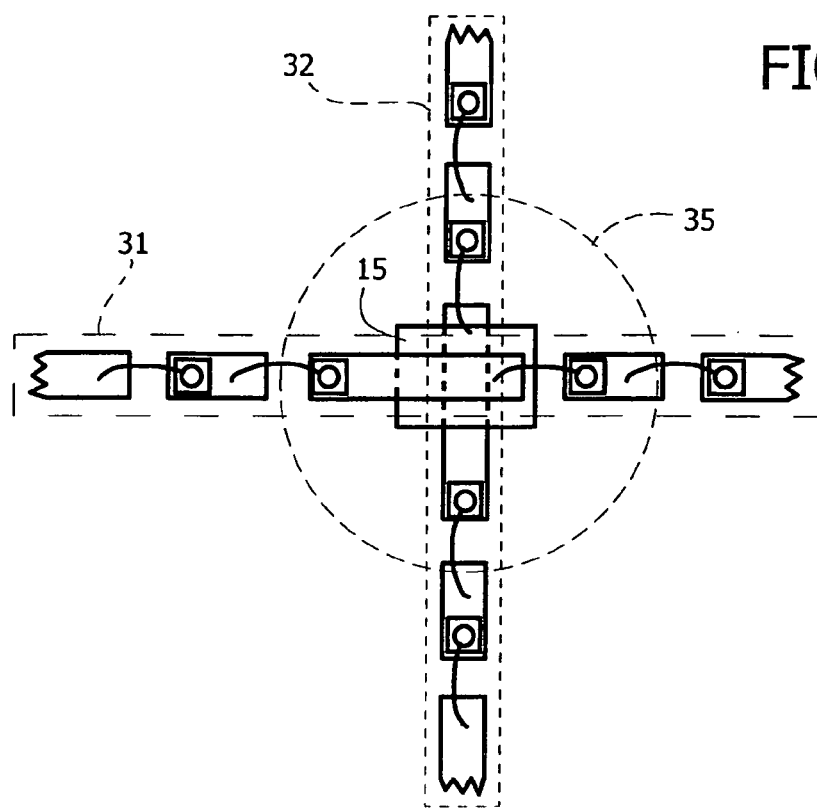

In a further embodiment, represented in FIGS. 6, 7 and 8, the LEDs are not arranged in a matrix configuration (i.e., individually addressable), but rather are addressable in groups, with the LEDs of each group electrically connected together in parallel (FIG. 7) or in series (FIG. 8).

FIG. 6 illustrates an example of an image that can be presented on a display according to the present invention.

Each segment (31, 32, 33, 34, 37, 38 and 39) represents a set of LEDs electrically connected in parallel (FIG. 7) or in series (FIG. 8).

In the embodiment represented in FIG. 7, each segment (31, 32) is addressable in an independent way, and is constituted by a pair of parallel paths, one of which is electrically connected to the electrodes of the same type (for example, the cathodes) of a parallel of LEDs, whilst the other is electrically connected to the electrodes of the other type (for example, the anodes). In points of intersection 35 between two or more segments it is necessary to insulate electrically the paths belonging to different segments. This is obtained, according to the present invention, by depositing on the paths 32 of one of said segments, at the point of intersection 35, a pad 15 of electrically insulating material, on which the paths 31 of the second of said segments are subsequently deposited.

FIG. 8 represents a variant, in which both of the segments are constituted by a set of LEDs connected together in series. In the point of intersection 35 between the two segments, the electrical insulation between the path 31 of the first segment and the path 32 of the second segment is obtained in a way similar to what is described with reference to FIG. 7.

Again with reference to FIG. 6, it is evident that the smaller the number of LEDs used to obtain the segments 31, 32, 33, 34, 37, 38 and 39, the more the appearance of said segments of the image will be dashed.

Figure 10:
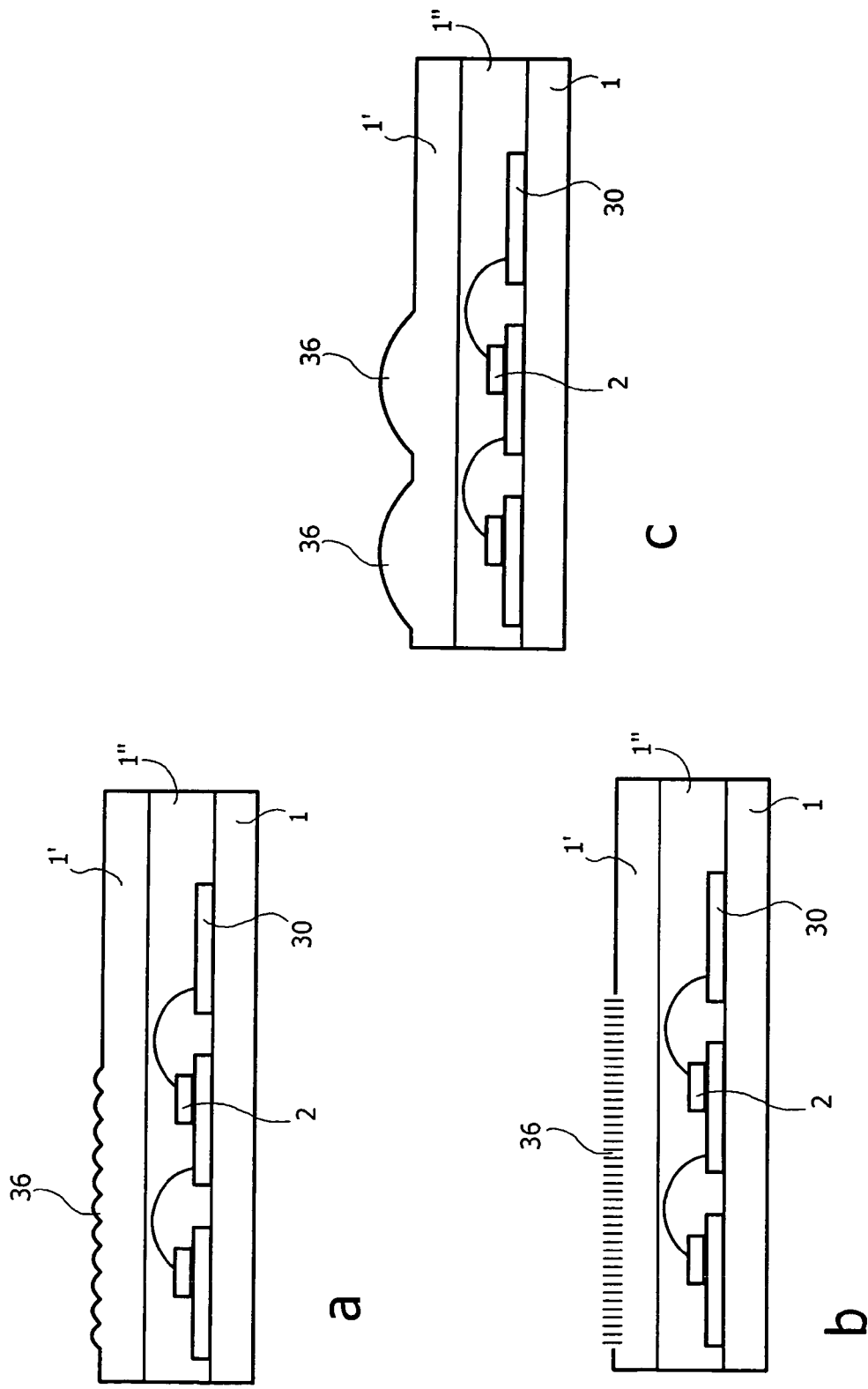

In order to limit the number of LED sources, at the same time reducing this effect of dashed appearance of the image, according to a variant of said invention (FIGS. 9 and 10) it is proposed to provide on the outer surface of the underlayer 1 and/or of the overlayer 1', in areas corresponding to the dice, appropriate micro-indentations 36 along the line of connection of the dice, said micro-indentations 36 having the function of extracting light from the underlayer 1 and/or from the overlayer 1' so as to connect points of light and generate light images in the form of continuous lines.

The above effect can be further reinforced by the metal pads that are deposited on the paths made of TCO for the purpose of improving adhesion of the bonding operations (or else directly by the conductive paths 30 that connect the sources in the case where said paths are made of metal instead of TCO). In fact, said pads tend to reflect part of the light emitted by the lateral surfaces of the die; the light thus reflected impinges upon the micro-indentations 36, which produce an increase in the effective dimensions of the source.

A further solution that can be adopted is to deposit the protective resin 1" in the form of paths that connect the various LED chips. The light emitted by the LED chips is thus in part entrapped by said paths of resin (light-guide effect) and subsequently extracted by purposely provided micro-indentations 36 made on the surface of said path of resin, or else, in the case where an overlayer 1' is used, on the surface of said overlayer.

Said micro-indentations 36 may be in the form of cylindrical microlenses with axis perpendicular to the line of connection of the dice (FIG. 10a), generic grooves made along an axis perpendicular to the line of connection of the dice (FIG. 10b), or cylindrical lenses (one for each chip) with axis perpendicular to the line of connection of the chips (FIG. 10c). The micro-indentations 36 may also be simply areas with high roughness, such as to diffuse the light emitted by the LEDs.

According to a further variant of the present invention, said effect of dashed appearance of the image can be reduced or eliminated using a density of LED sources, i.e., a number of dice per unit length, such that the angular separation between two sources with respect to the eye of the user is comparable with the angular resolution of the eye.

By way of example, if the display is installed at a distance of 1 m from the driver and the distance between two adjacent dice is 0.3 mm, i.e., comparable with the dimensions of the die, the angular separation between the LEDs is approximately 1 minute of an arc, equal to the resolution of the eye in the fovea.

It is known, however, how the eye tends to merge points angularly separated by up to 3 minutes of arc, which would enable the spacing between the pixels to be increased up to 1 mm, thus reducing the number of sources necessary by a factor of 3.

What is claimed is:

1. A head-up transparent-display device in a motor vehicle, which is used for the presentation of information to a driver and/or to a passenger, said device comprising:
    a transparent underlayer which is at least in part superimposed on a windshield of the vehicle, in such a way that at least part of the information presented to the user is superimposed on a background, said background being visible to the user through said windshield;
    a plurality of LED sources, addressable in groups through a series of conductive paths, deposited on said transparent underlayer and connected to a control electronics;
    said LED sources integrated in the form of dice, consisting of elements obtained by dividing up a semiconductor wafer and without package;
    said dice integrated on, and electrically connected to said underlayer using technologies of the chip-on-board (COB) type;
    said LED sources arranged in groups, in which the LEDs belonging to one and the same group are electrically connected in series so as to form a segment of a curve, or of a straight line, or of a broken line;
    a plurality of conductive paths, each conductive path of said plurality belonging to a same segment including a number of separate path portions each having a die-LED with a lower electrode attached above the associated path portion and an upper electrode connected by wire-bonding to a subsequent pad portion;
    a first conductive path and a second conductive path of said plurality of conductive paths superimposed on each other at a point of intersection; and
    an electrically insulating pad interposed between said first conductive path and said second conductive path at said point of intersection.

2. The device according to claim 1, wherein said conductive paths are made of transparent conductive oxide TCO.

3. The device according to claim 1, wherein said conductive paths are made of metal.

4. The device according to claim 1, wherein said LED sources in the form of dice are protected from the external stresses by means of a transparent resin.

5. The device according to claim 4, wherein said transparent resin is deposited in the form of a continuous layer.

6. The device according to claim 4, wherein said transparent resin is deposited in the form of paths, each of said paths connecting groups of dice belonging to one and the same segment of the image.

7. The device according to claim 5, wherein bonded on said transparent resin is a transparent overlayer, said overlayer being used for guaranteeing the planarity of the protective layer of transparent resin, in such a way as to ensure that the device will not distort the vision of the background and/or will not introduce optical power.

8. The device according to claim 7, wherein on the surface of at least one of the underlayer and the overlayer micro-indentations are made in areas corresponding to the connection lines between adjacent dice, in such a way that the points of light visible to the user when said dice are turned on are connected by segments of light which are also visible to the user.

9. The device according to claim 8, wherein said micro-indentations are in the form of cylindrical lenses having axes perpendicular to said connection lines.

10. The device according to claim 8, wherein said micro-indentations are in the form of microlenses with rotational symmetry, each microlens having an axis of symmetry perpendicular to said underlayer and passing through the centre of one of said dice.

11. The device according to claim 8, wherein said micro-indentations are in the form of grooves made along an axis perpendicular to said connection lines.

* * * * *